United States Patent [19]
Humbert et al.

[11] Patent Number: 5,124,889
[45] Date of Patent: Jun. 23, 1992

[54] ELECTROMAGNETIC SHIELDING APPARATUS FOR CELLULAR TELEPHONES

[75] Inventors: Gary A. Humbert, Oakbrook Terrace; Ross P. Goodwin, Chicago, both of Ill.

[73] Assignee: Motorola, Inc., Schaumburg, Ill.

[21] Appl. No.: 513,721

[22] Filed: Apr. 24, 1990

[51] Int. Cl.$^5$ ............................................. H05K 9/00
[52] U.S. Cl. .................................. 361/424; 174/35 R; 174/35 TS; 174/51; 361/399; 361/427; 439/108; 439/109
[58] Field of Search .................... 174/35 R, 35 TS; 361/212, 220, 392, 394, 395, 414, 419, 424, 427, 399; 439/607, 608, 609, 610, 108, 109

[56] References Cited
U.S. PATENT DOCUMENTS

| | | | |
|---|---|---|---|
| 4,028,794 | 6/1977 | Ritchie et al. | 439/65 |
| 4,085,998 | 4/1978 | Owens | 439/65 |
| 4,245,876 | 1/1981 | Richie et al. | 439/65 |
| 4,252,389 | 2/1981 | Olsson | 439/65 |
| 4,890,199 | 12/1989 | Beutler | 361/424 |
| 5,029,254 | 7/1991 | Stickney | 174/35 GC |

FOREIGN PATENT DOCUMENTS

| | | | |
|---|---|---|---|
| 0207226 | 1/1987 | European Pat. Off. | 361/424 |
| 2223359 | 4/1990 | United Kingdom | 361/424 |

OTHER PUBLICATIONS

IBM Technical Disclosure Bulletin "Contact Surface for Printed Circuit Card" by D. O. Johnson, Jr. vol. 9 No. 10 Mar. 1967.

Primary Examiner—Leo P. Picard
Assistant Examiner—D. Sparks
Attorney, Agent, or Firm—Rolland R. Hackbart

[57] ABSTRACT

Electromagnetic shielding apparatus for portable telephones (300) and other electronic equipment, includes shield clips (100) for intercoupling the conductive surfaces of a housing (302 and 303) to the metal layer (205) of the circuit board (200). Each shield clip (100) mates with a corresponding edge (204) of the circuit board (200) such that tabs (208, 209, 210) insert into holes (108, 109, 110) in the central channel (111-113) of the clip (100) and feet (101, 102, 103) of the clip rest on other tabs (201, 202, 203). The clip (100) is bonded to the metal layer (205) of the circuit board preferably by resistance welding, thereby reliably connecting the clip (100) and the conductive housing surfaces to signal ground.

6 Claims, 3 Drawing Sheets

ELECTROMAGNETIC SHIELDING APPARATUS FOR CELLULAR TELEPHONES

BACKGROUND OF THE INVENTION

The present invention is generally related to radiotelephones, and more particularly to electromagnetic shielding apparatus for cellular telephones.

Cellular telephones and other electronic equipment, such as, for example, computers and microwaves, generate electromagnetic signals which may radiate to and interfere with another portion of that equipment or with another piece of electronic equipment located nearby. To minimize such interference, electrically conducting material in the form of a shield is typically interposed between the source of electromagnetic signals and the circuitry subject to interference. Such shields may take the form of a wall or a complete enclosure placed around the source of electromagnetic signals and/or around the circuitry subject to interference. For example, opposite sides of a circuitry board may be shielded from one another by enclosing each side of the circuit board by a housing portion having a conductive surface, as illustrated, for example, in U.S. Pat. No. 4,890,199. When using such shields, it is very important that the conductive surface of the housing portion be reliable connected to signal ground. For the foregoing reasons, there is a need for electromagnetic shielding apparatus for cellular telephones and other electronic equipment, which reliably shields circuitry therein which is subject to electromagnetic interference from internally and externally generated electromagnetic signals.

OBJECTS OF THE INVENTION

Accordingly, it is an object of the present invention to provide a unique electromagnetic shielding apparatus for cellular telephones and other electronic equipment, which reliably shields circuitry therein which is subject to electromagnetic interference from internally and externally generated electromagnetic signals.

DETAILED DESCRIPTION OF THE PREFERRED EMBODIMENT

Figure 1:
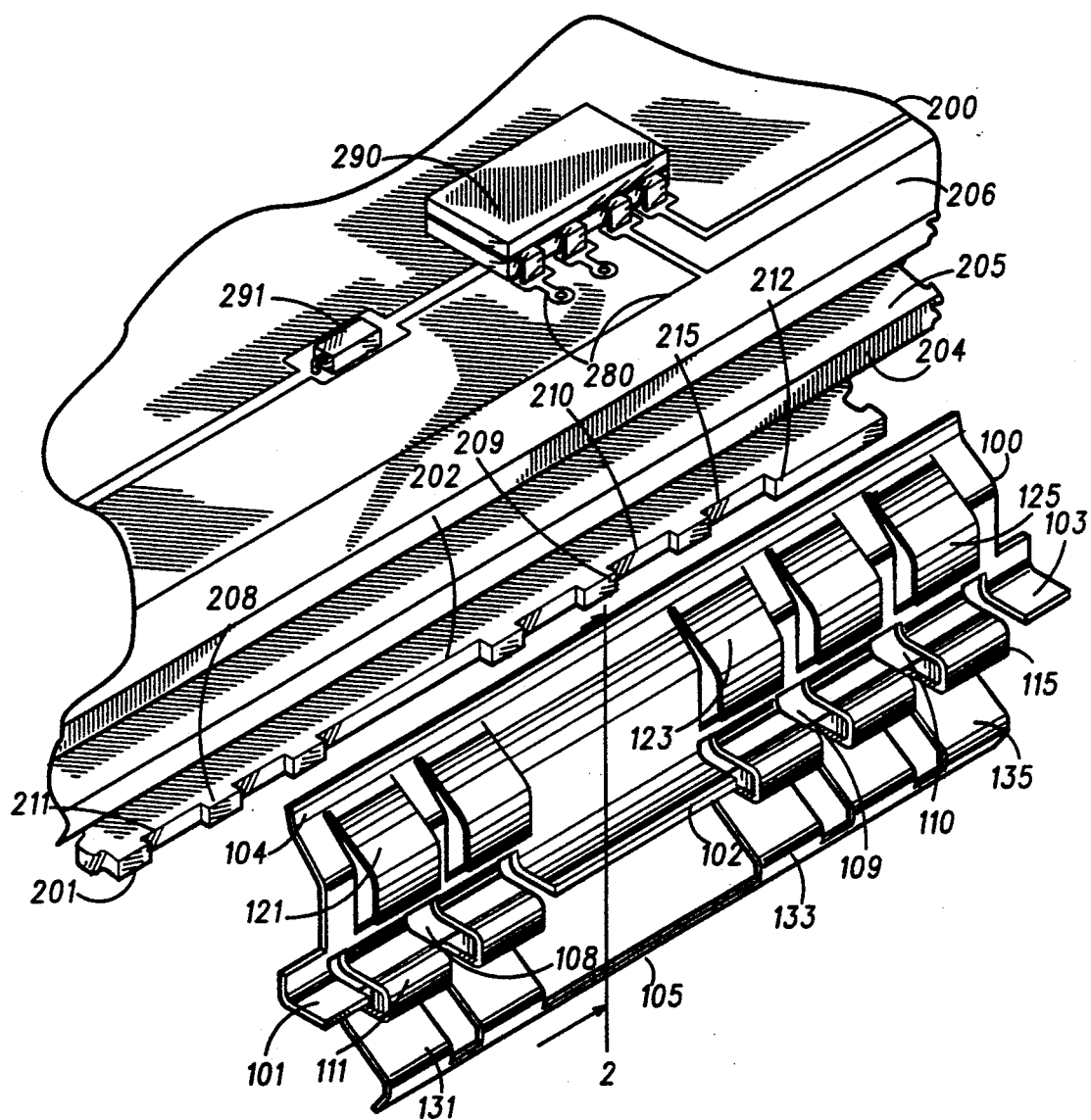
FIG. 1 is an exploded view of spring clip 100 and circuit board section 200, embodying the present invention.

Referring to FIG. 1, there is illustrated an exploded view of spring clip 100 and circuit board section 200, embodying the present invention. Clip 100 includes spring fingers 121-125 and 131-135, feet 101-103, and central channel 111-115. Spring fingers 121-125 each extend from outer edge 104 and have one free end, and spring fingers 131-135 each extend from central channel 111-115 to outer edge 105, being attached on both ends. Central channel includes three holes 108-110.

Circuit board 200 includes a metal layer 205 having an exposed edge 204 (and at least one other exposed edge similar to edge 204 but not shown), electronic circuitry layer 206 with conductive circuitry 280, electronic circuitry layer 207 (see FIG. 2), and electronic components 290 and 291 bonded to electronic circuitry layer 206. Circuit board 200 preferably includes control circuitry on one side (eg., components 290 and 291 on circuitry layer 206 in FIGS. 1 and 2) and radio frequency circuitry on the other side (eg., component 292 on circuitry layer 207 in FIG. 2) for use in portable telephone 300 in FIG. 3.

Central channel 111-115 of clip 100 mates with edge 204 of circuit board 200, such that channel portion 111 inserts into notch 211, channel portion 115 inserts into notch 215, foot 101 rests on tab 201, foot 102 rests on tab 202, foot 103 rests on tab 203, tab 208 inserts into hole 108, tab 209 inserts into hole 109, tab 210 inserts into hole 110, etc. Once mated with edge 204, and at least one other clip similar to clip 100, but not shown, mates the other edge similar to edge 204) clip 100 may then be attached to metal layer 205 by bonding it to feet 101-103 by welding or any other suitable means. In the preferred embodiment, feet 101-103 of clip 100 are resistance welded to metal layer 205.

Figure 2:
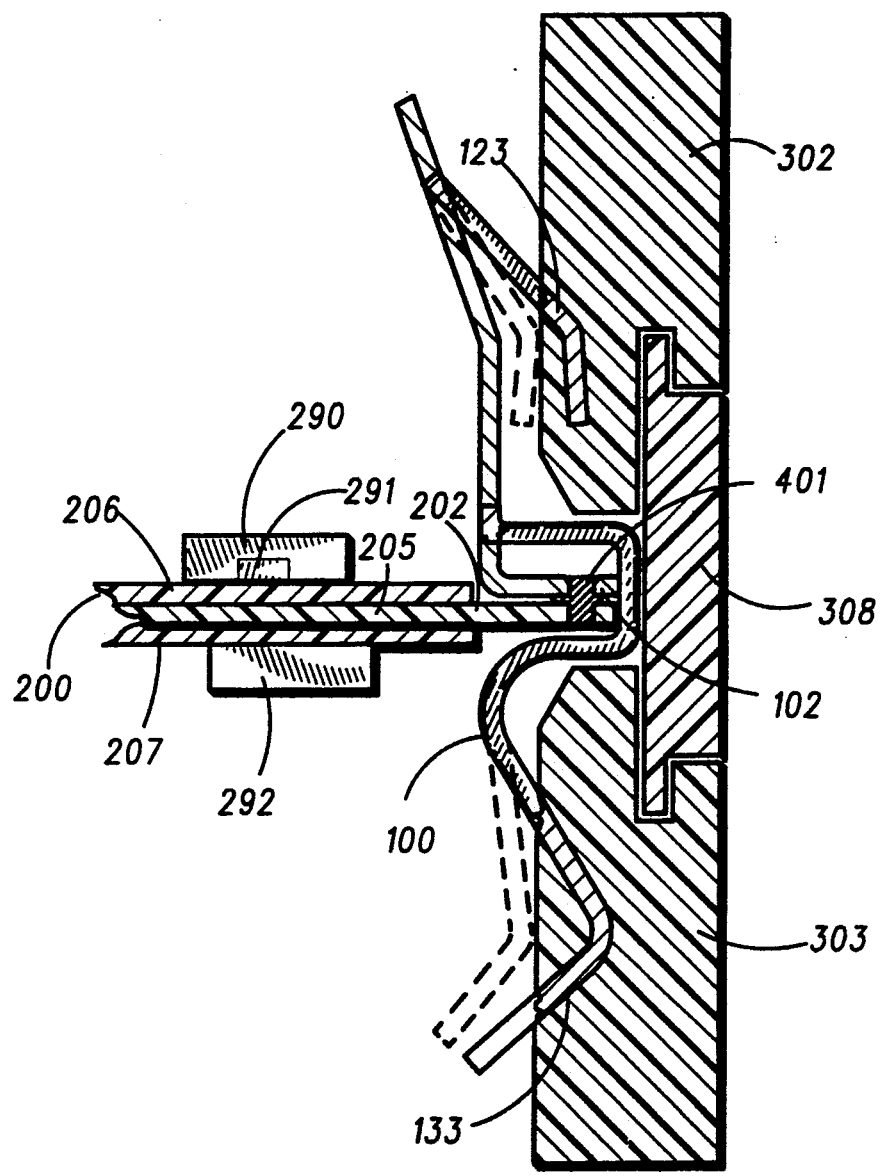
FIG. 2 is a section of the spring clip 100 in FIG. 1 taken along line 2.

Referring next to FIG. 2, there is illustrated a section of the spring clip 100 and circuit board 200 in FIG. 1 taken along line 2. Tab 202 of circuit board 200 is bonded to foot 102 of clip 100 by weld 401, produced by resistance welding. When top housing portion 302 is mated with bottom housing portion 303, circuit board 200 is held in place and fingers 123 and 133 are pressed (shown by dashed lines) against the conductive inner surfaces of housing portions 302 and 303 for coupling electrical signal ground from metal layer 204 of circuit board 200 to the conductive inner surfaces of housing portions 302 and 303.

Figure 3:
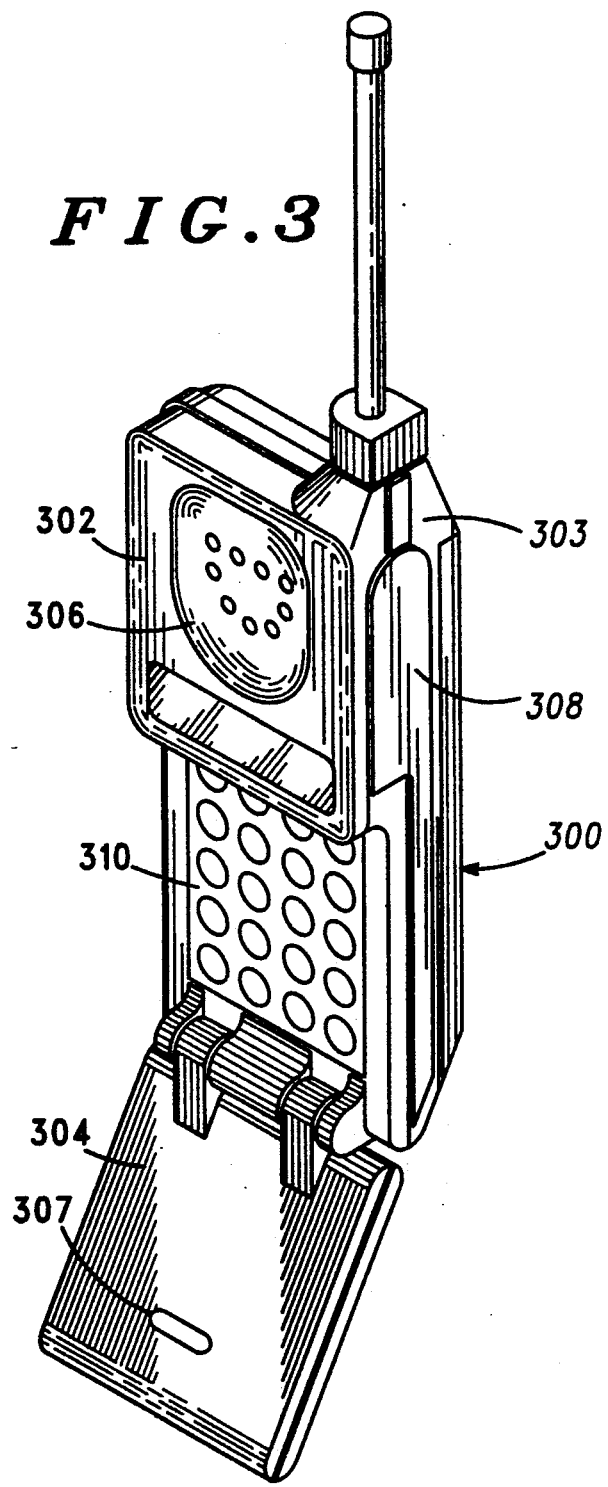
FIG. 3 is a portable telephone 300 including the spring clip 100 and circuit board section 200 illustrated in FIG. 1.

Referring to FIG. 3, portable telephone 300 is, in the preferred embodiment, a cellular portable telephone, which includes a cellular telephone transceiver having a radio transmitter, radio receiver and control unit, such as, for example, the MICROTAC personal telephone marketed and sold by Motorola, Inc., Cellular Subscriber Group, 1475 West Shure Drive, Arlington Heights, Ill. 60004. Portable telephone 300 includes top housing portion 302 which mates with bottom housing portion 303, both of which have conductive inner surfaces which surround circuit board 200. The exposed mating edge of top and bottom housing portions 302 and 303 is covered by element 308. Portable telephone 300 also includes speaker ports 306, keypad 310, and retractable flip 304 with microphone port 307. The structure of portable telephone 300 is described in further detail in U.S. Pat. No. 4,890,199, incorporated herein by reference.

In summary, unique electromagnetic shielding apparatus for portable telephones and other electronic equipment, includes shield clips for intercoupling the conductive housing surfaces to the metal layer of the circuit board. Each shield clip mates with a corresponding edge of the circuit board such that tabs insert into holes in the central channel of the clip and feet of the clip rest on other tabs. The clip is bonded to the metal layer of the circuit board preferably by resistance welding, thereby reliably connecting the clip and the conductive housing surfaces to signal ground.

We claim:

1. Electromagnetic shielding apparatus comprising in combination:

a housing having mating top and bottom portions each having conductive inner surfaces;

a substrate having an electronic circuitry layer, having a metal layer, and having at least one edge portion having at least two notches therein for producing an extending tab and exposing said metal layer, said substrate sandwiched between the top and bottom portions of said housing when mated;

at least one electronic component bonded to the electronic circuitry layer of the substrate;

at least one clip means having a first and second set of spring fingers on opposite sides of a substantially central channel, said central channel having first and second portions separated by a hole therein and at least two feet, the at least one edge portion of the substrate inserted into the central channel of said at least one clip means, such that the extending tab inserts into the hole in the central channel and said feet rest on said substrate; and means for coupling said feet to the metal layer of said substrate, whereby said metal layer of said substrate is electrically coupled by the fingers of said at least one clip means to the conductive surfaces of said top and bottom portions of said housing.

2. The electromagnetic shielding apparatus according to claim 1, wherein said means for coupling comprises a weld produced by welding said feet to said metal layer.

3. A method for electromagnetically shielding electronic components bonded to a substrate and enclosed in a housing, said substrate having an electronic circuitry layer and a metal layer, said housing having mating top and bottom portions each having conductive inner surfaces for enclosing said electronic components, said method comprising the steps of:

notching at least one edge portion of said substrate to produce an extending tab and exposing said metal layer;

bonding at least one clip means to the notched at least one edge portion, said at least one clip means having a first and second set of spring fingers on opposite sides of a substantially central channel, said central channel having first and second portions separated by a hole therein and at least two feet, the at least one edge portion of the substrate inserted into the central channel of said at least one clip means, such that the extending tab inserts into the hole in the central channel and said feet rest on said substrate; and mating said top and bottom portions of said housing, whereby said metal layer of said substrate is electrically coupled by the fingers of said at least one clip means to the conductive surfaces of said top and bottom portions of said housing.

4. The method according to claim 3, wherein said bonding step includes the step of welding said feet to said metal layer.

5. A cellular telephone, comprising:

cellular transceiver means;

a housing having mating top and bottom portions each having conductive inner surfaces for enclosing said cellular transceiver means;

a substrate having first and second surfaces each with an electronic circuitry layer, having a metal layer, and having at least one edge portion with at least two notches therein for producing an extending tab and exposing said metal layer, said substrate sandwiched between the top and bottom portions of said housing when mated;

said cellular transceiver means including control circuitry components bonded to the electronic circuitry layer on the first surface of the substrate, and including radio frequency circuitry components bonded to the electronic circuitry layer on the second surface of the substrate;

at least one clip means having a first and second set of spring fingers on opposite sides of a substantially central channel, said central channel having first and second portions separated by a hole therein and at least two feet, the at least one edge portion of the substrate inserted into the central channel of said at least one clip means, such that the extending tab inserts into the hole in the central channel and said feet rest on said substrate; and means for coupling said feet to the metal layer of said substrate, whereby said metal layer of said substrate is electrically coupled by the fingers of said at least one clip means to the conductive surfaces of said top and bottom portions of said housing.

6. The electromagnetic shielding apparatus according to claim 5, wherein said means for coupling comprises a weld produced by welding said feet to said metal layer.

* * * * *